US009312146B2

(12) United States Patent
Kong et al.

(10) Patent No.: US 9,312,146 B2
(45) Date of Patent: Apr. 12, 2016

(54) MANUFACTURING METHOD OF A THIN FILM TRANSISTOR

(71) Applicant: BOE TECHNOLOGY GROUP CO., LTD., Beijing (CN)

(72) Inventors: Xiangyong Kong, Beijing (CN); Jun Cheng, Beijing (CN); Dongfang Wang, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/354,320

(22) PCT Filed: Oct. 29, 2013

(86) PCT No.: PCT/CN2013/086142
§ 371 (c)(1),
(2) Date: Apr. 25, 2014

(87) PCT Pub. No.: WO2014/127645
PCT Pub. Date: Aug. 28, 2014

(65) Prior Publication Data
US 2015/0102338 A1 Apr. 16, 2015

(30) Foreign Application Priority Data

Feb. 19, 2013 (CN) .......................... 2013 1 0053699
Jun. 5, 2013 (CN) .......................... 2013 1 0221456

(51) Int. Cl.
*H01L 21/8234* (2006.01)
*H01L 21/445* (2006.01)
(Continued)

(52) U.S. Cl.
CPC ........ *H01L 21/445* (2013.01); *H01L 29/41733* (2013.01); *H01L 29/41758* (2013.01);
(Continued)

(58) Field of Classification Search
CPC ...... H01L 27/1214–27/1296; H01L 29/66765; H01L 29/458; H01L 29/78669; H01L 29/78618; H01L 29/78678; H01L 27/1288; H01L 29/78621
USPC .......................................................... 438/158
See application file for complete search history.

(56) References Cited

U.S. PATENT DOCUMENTS 5,286,659 A     2/1994  Mitani et al.
2001/0045558 A1* 11/2001  Kawasaki et al. ............... 257/66
(Continued)

FOREIGN PATENT DOCUMENTS

CN       1619392 A    5/2005
CN     101970131 A    2/2011
(Continued)

OTHER PUBLICATIONS

Korean Office Action dated Apr. 30, 2015; Appln. No. 10-2014-7012935.
(Continued)

*Primary Examiner* — Tucker J Wright
(74) *Attorney, Agent, or Firm* — Ladas & Parry LLP

(57) ABSTRACT

Embodiments of the invention provide a thin film transistor and a manufacturing method thereof and a display device. The thin film transistor includes a gate electrode, a gate insulation layer, an active layer, an ohmic contact layer, a source electrode and a drain electrode, and the source electrode and the drain electrode are connected to the active layer by the ohmic contact layer. The ohmic contact layer is provided at a lateral side of the active layer and contacts the lateral side of the active layer.

8 Claims, 18 Drawing Sheets

(51) Int. Cl.
  *H01L 29/417* (2006.01)
  *H01L 29/786* (2006.01)
  *H01L 29/66* (2006.01)
  *H01L 29/423* (2006.01)
  *H01L 27/12* (2006.01)

(52) U.S. Cl.
  CPC .... *H01L29/41775* (2013.01); *H01L 29/42384* (2013.01); *H01L 29/66969* (2013.01); *H01L 29/7869* (2013.01); *H01L 29/78618* (2013.01); *H01L 29/78621* (2013.01); *H01L 27/1288* (2013.01)

(56) References Cited

U.S. PATENT DOCUMENTS

| | | | | |
|---|---|---|---|---|
| 2002/0068372 | A1* | 6/2002 | Kunii | 438/30 |
| 2005/0099551 | A1 | 5/2005 | Yang et al. | |
| 2006/0284181 | A1* | 12/2006 | Chae et al. | 257/66 |
| 2007/0296333 | A1 | 12/2007 | Kim et al. | |
| 2010/0320453 | A1* | 12/2010 | Tanaka et al. | 257/40 |
| 2011/0204334 | A1* | 8/2011 | Kim et al. | 257/40 |
| 2011/0241012 | A1* | 10/2011 | Yamazaki et al. | 257/71 |
| 2013/0009161 | A1* | 1/2013 | Himori | 257/60 |
| 2013/0181200 | A1 | 7/2013 | Murata | |

FOREIGN PATENT DOCUMENTS

| | | |
|---|---|---|
| JP | 2000-323714 A | 11/2000 |
| JP | 2012-204502 A | 10/2012 |
| KR | 20050045281 A | 5/2005 |
| KR | 20060102698 A | 9/2006 |
| KR | 20070121376 A | 12/2007 |
| WO | 2012/039272 A1 | 3/2012 |

OTHER PUBLICATIONS

First Chinese Office Action dated May 18, 2015; Appln. No. 201310221456.6.
International Preliminary Report on Patentability Appln. No. PCT/CN2013/086142; Dated Aug. 25, 2015.

* cited by examiner

MANUFACTURING METHOD OF A THIN FILM TRANSISTOR

TECHNICAL FIELD

Embodiments of the invention relate to a thin film transistor and a manufacturing method thereof, and a display device.

BACKGROUND

In recent years, with the rapid development of display technology, thin film transistor used to drive and control a pixel of a display device has been developed as well, and has been developed from amorphous silicon thin film transistor and low temperature poly-Si thin film transistor to oxide thin film transistor.

The oxide thin film transistor has excellent characteristics in electron mobility, on-state current, switching performance and so on. In addition, the oxide thin film transistor further has advantages of few non-uniform device characteristics, low cost, low process temperature, capable of employing a coating process, high transmittance, large band gap and so on. The oxide thin film transistor can be used to the display device requiring fast response and large current, such as a liquid crystal display with high frequency, high resolution or large size, organic light emitting display and so on.

FIG. 1 is a cross-section schematic view illustrating a conventional oxide thin film transistor. As shown in FIG. 1, the conventional oxide thin film transistor comprises a substrate 1, a gate electrode 2, a gate insulation layer 3, an active layer 4, ohmic contact layers 5a and 5b, an etching barrier layer 6, a source electrode 7a and a drain electrode 7b. The ohmic contact layers 5a and 5b are formed by using the following process: firstly depositing an oxide thin film having better conductivity than the active layer on the active layer, and then forming the ohmic contact layers by an etching process. By forming the ohmic contact layers 5a and 5b, the schottky effect between the source and drain electrodes and the active layer can be reduced, and the contact property between the source and drain electrodes and the active layer can be improved.

However, the active layer and the ohmic contact layers in the oxide thin film transistor are all formed by oxide material, and it is difficult to control the etching process for etching the oxide thin film to form the ohmic contact layer by using an etching solution, and the etching solution is very likely to damage the oxide active layer.

SUMMARY

According to one aspect of the invention, a thin film transistor is provided. The thin film transistor comprises a gate electrode, a gate insulation layer, an active layer, an ohmic contact layer, a source electrode and a drain electrode, and the source electrode and the drain electrode are connected to the active layer by the ohmic contact layer. The ohmic contact layer is provided at a lateral side of the active layer and contacts the lateral side of the active layer.

According to another aspect of the invention, a display device is provided. The display device comprises the above-described thin film transistor.

According to still another aspect of the invention, a manufacturing method of a thin film transistor is provided. The thin film transistor comprises a gate electrode, a gate insulation layer, an active layer, an ohmic contact layer, a source electrode and a drain electrode. The method comprises: forming the ohmic contact layer by using an injection process.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIGS. 5A-5R are cross-section schematic views illustrating a manufacturing method of a thin film transistor according to a third embodiment of the invention, wherein

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The embodiments of the invention provide a thin film transistor and a manufacturing method thereof, an array substrate and a manufacturing method thereof, and a display device. In the manufacturing method of the thin film transistor, a patterning process is performed on a gate insulation layer to form a first groove and a second groove communicated with each other in the gate insulation layer, the first groove corresponds to a region where an active layer is to be formed and has a shape same as the active layer, the second groove corresponds to a region where an ohmic contact layer is to be formed and has a shape same as the ohmic contact layer, and a raw material for forming the ohmic contact layer is injected into the second groove to form the ohmic contact layer. In this way, the ohmic contact layer having a desired shape can be directly formed, and an etching process for forming the ohmic contact layer can be omitted. Therefore, the process for forming the ohmic contact layer can be easily controlled, and damage caused by an etching solution (which is used in the etching process for forming the ohmic contact layer) on the active layer and the ohmic contact layer can be avoided.

First Embodiment

The first embodiment of the invention provides a manufacturing method of a thin film transistor. The method comprises a procedure of forming a gate electrode, a gate insulation layer, an etching barrier layer, a source electrode and a drain electrode, and the method further comprises a procedure of forming an active layer and an ohmic contact layer. The procedure of forming the active layer and the ohmic contact layer comprises: performing a patterning process on the gate insulation layer to form a first groove and a second groove communicated with each other in the gate insulation layer, wherein the first groove corresponds to a region where the active layer is to be formed and has a shape same as the active layer, the second groove corresponds to a region where the ohmic contact layer is to be formed and has a shape same as the ohmic contact layer; and forming the active layer in the first groove and forming the ohmic contact layer in the second groove.

Referring to FIG. 2 and FIGS. 3A-3J, the method of manufacturing the thin film transistor according to the first embodiment of the invention mainly comprises the following steps.

Figure 1:
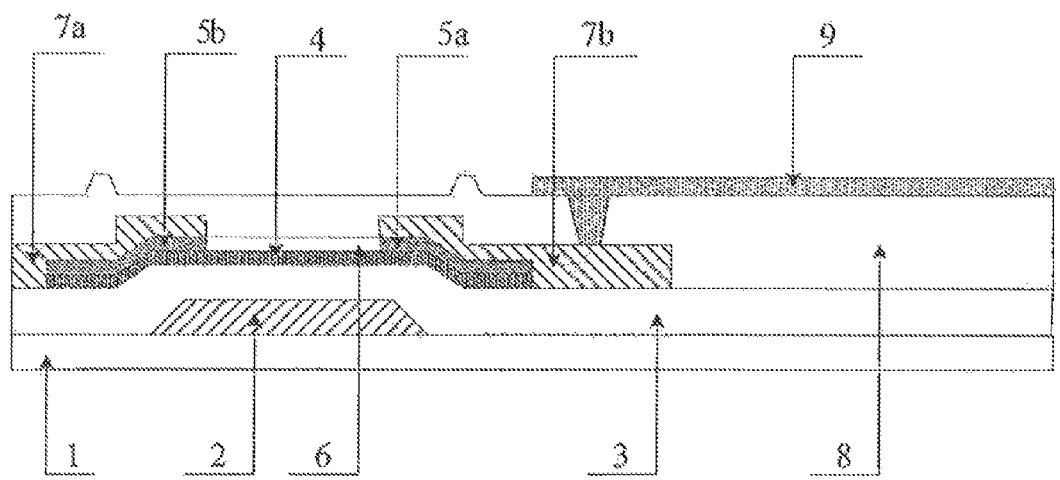
FIG. 1 is a cross-section schematic view illustrating a conventional oxide thin film transistor.
Figure 2:
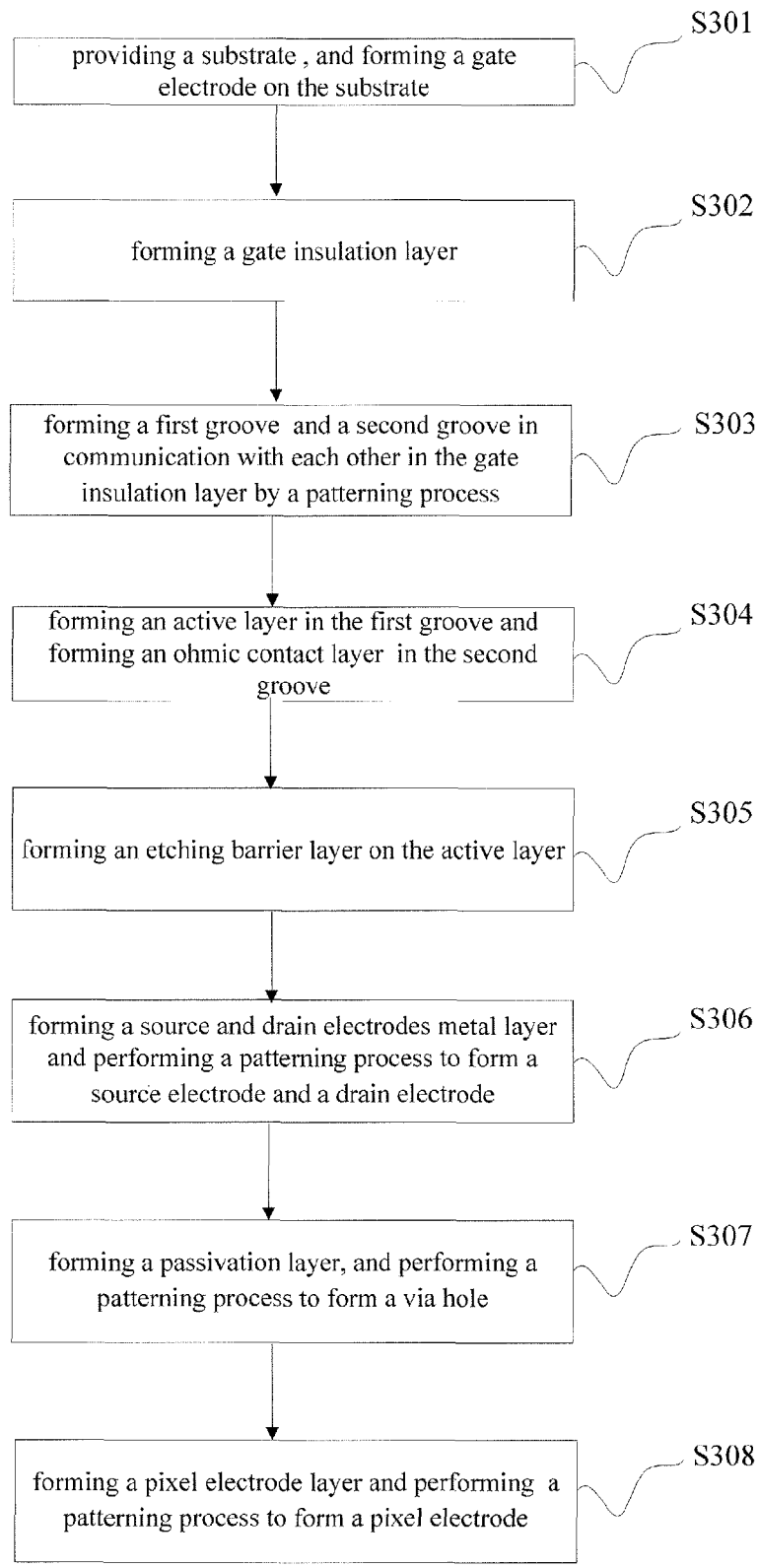
FIG. 2 is a flowchart illustrating a manufacturing method of a thin film transistor according to a first embodiment of the invention.
Figure 3A:
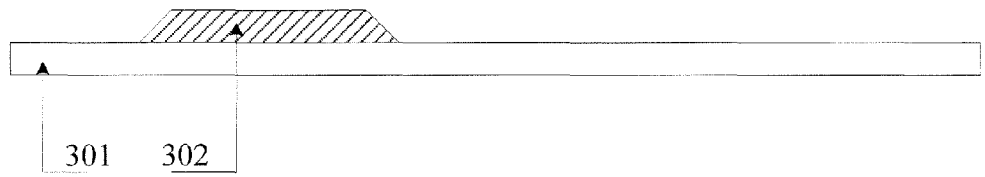
FIGS. 3A-3H are cross-section schematic views illustrating the manufacturing method of the thin film transistor according to the first embodiment of the invention.

Step 301: providing a substrate 301, and forming a gate electrode 302 on the substrate 301, as shown in FIG. 3A.

For example, the substrate 301 may be a substrate of inorganic material, such as a glass substrate, a quartz glass substrate and so on, or the substrate 301 may be a substrate of organic material.

For example, the gate electrode 302 may be a single layer formed by molybdenum (Mo), molybdenum niobium alloy (MoNb), aluminum (Al), aluminum neodymium alloy (AlNd), titanium (Ti) or copper (Cu), or the gate electrode 302 may be a laminated layer formed by two or more of the above-mentioned materials. Preferably, the gate electrode 302 is the single layer or the laminated layer formed by Mo, Al or an alloy comprising Mo, Al. A thickness of the gate electrode 302 may be about 100 nm~500 nm.

Figure 3B:
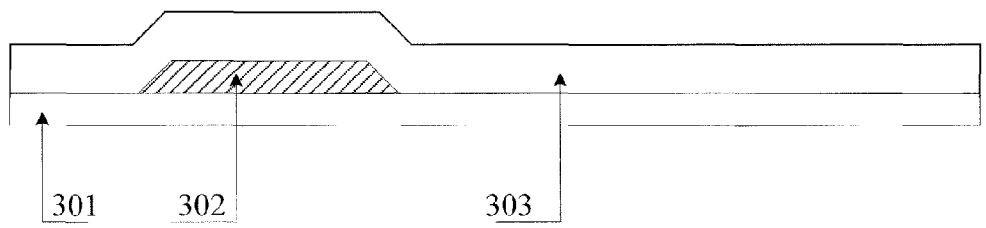

Step 302: forming a gate insulation layer 303 on the substrate after the step 301, as shown in FIG. 3B.

For example, the gate insulation layer 303 may be a single layer formed by silicon oxide (SiOx), silicon nitride (SiNx), hafnium oxide (HfOx), silicon oxynitride (SiON), or AlOx, or the gate insulation layer 303 may be a laminated layer formed by two or more of the above-mentioned materials. A plasma enhanced chemical vapor deposition (PECVD) process may be used to form the gate insulation layer 303. It should be noted that, there generally exist many silicon dangling bonds in the thin film formed by the PECVD process, which results in a large amount of defect states in the thin film. Thus, hydrogen atoms are introduced, so that the hydrogen atoms bond with the silicon dangling bonds to form the thin film with better quality. For example, the hydrogen content of the gate insulation layer 303 is higher than 1%. However, the hydrogen content of the gate insulation layer 303 should not be too large; the density of the thin film may be reduced if the hydrogen content is too large. Thus, preferably, the hydrogen content is controlled to be below about 10%. For example, the gate insulation layer 303 may be the laminated layer of SiNx and SiOx, or the gate insulation layer 303 may be the laminated layer of SiNx, SiON and SiOx. The total thickness of the gate insulation layer 303 may be about 300~600 nm, and the thicknesses of respective films in the gate insulation layer 303 may be adjusted according to the practical requirements.

Figure 3C:
Figure 3C:
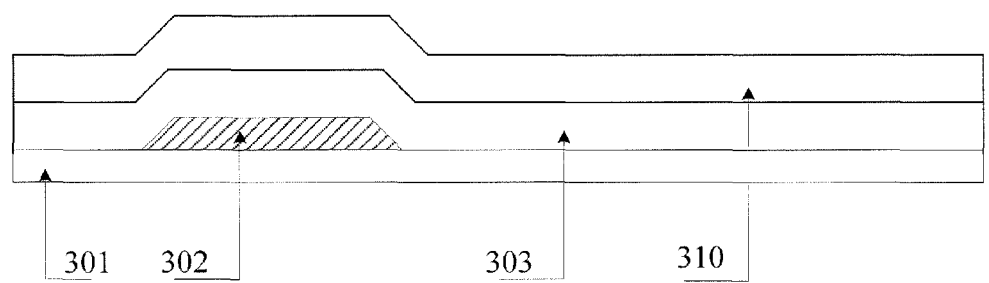
Figure 3D:
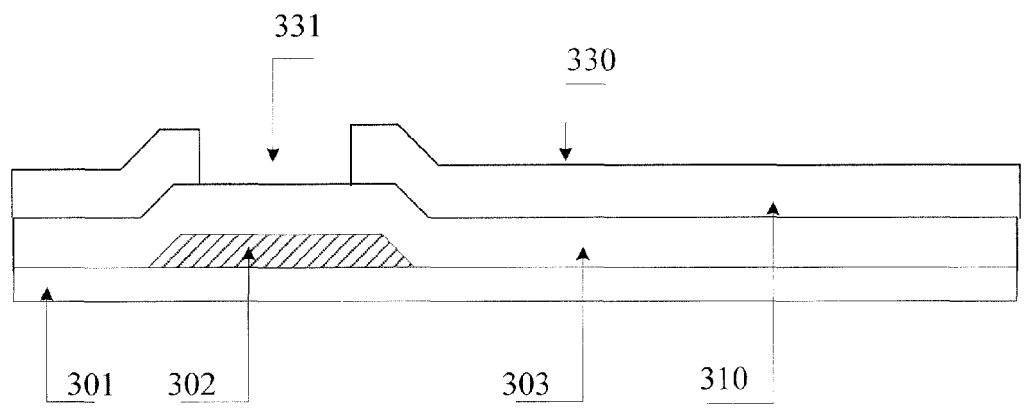
Figure 3E:
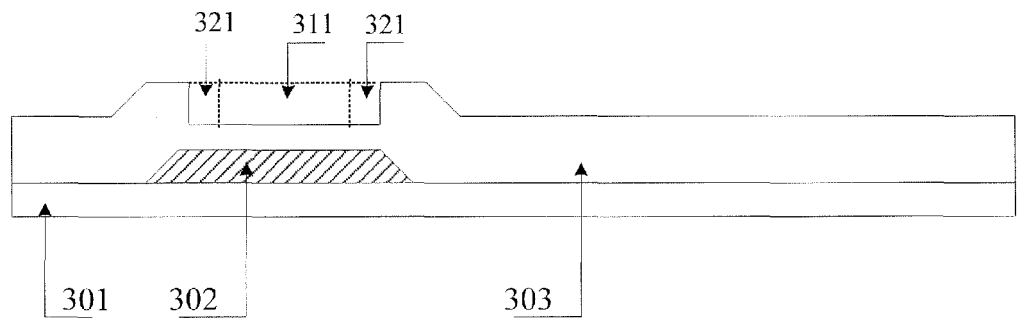

Step S303: performing a patterning process on the gate insulation layer 303 to form a first groove 311 and a second groove 321 communicated with each other in the gate insulation layer 303, wherein the first groove 311 corresponds to a region where an active layer is to be formed, the second groove 321 corresponds to a region where an ohmic contact layer is to be formed, and the second groove 321 is provided outside of the first groove 311 and is communicated with the first groove 311, as shown in FIG. 3E.

The following description of the step 303 is made by taking the case that a positive photoresist is employed as an example. First, a photoresist layer 310 is formed on the gate insulation layer 303, and then exposing and developing processes are performed on the photoresist layer 310 by using a mask plate 312. The mask plate 312 comprises a light transmitting region 312a and a light blocking region 312, as shown in FIG. 3C. After the exposing and developing processes, a photoresist-completely-retained region 330 and a photoresist-completely-removed region 331 are formed, as shown in FIG. 3D. The gate insulation layer at the photoresist-completely-removed region 331 is etched to simultaneously form the first groove 311 and the second groove 321 communicated with each other, as shown in FIG. 3E.

For example, the first groove 311 and the second groove 321 have the same depth.

Figure 3F:
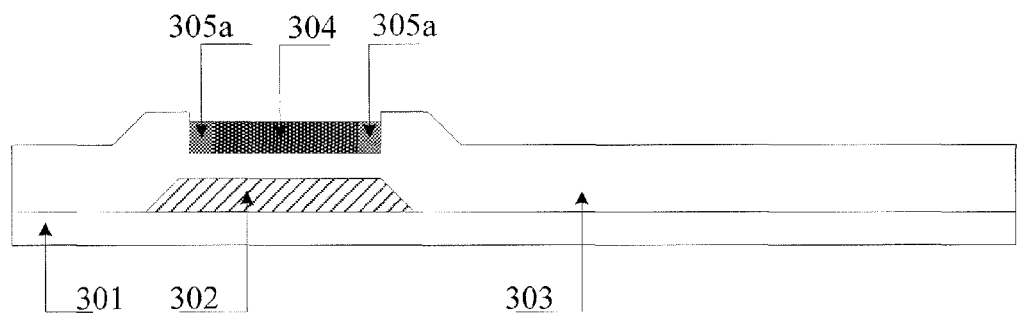

Step 304, forming the active layer 304 in the first groove 311 and forming the ohmic contact layer 305a in the second groove 321, as shown in FIG. 3F.

For example, a semiconductor layer is firstly formed, and then the semiconductor layer is patterned to form the active layer 304 in the first groove 311. For example, the semiconductor layer may be formed by a sputtering process, an epitaxial growth process and so on.

For example, the active layer 304 may be formed directly by a sputtering process with a mask, or an injection process such as inkjet printing process. When using the inkjet printing process, it needs to perform a curing and annealing process, and the annealing temperature may be set to 200~500° C.

For example, the active layer 304 may be formed by an oxide material comprising elements indium (In), gallium (Ga), zinc (Zn), tin (Sn) and so on, such as indium gallium zinc oxide (IGZO), indium zinc oxide (IZO), indium tin oxide (InSnO), indium gallium tin oxide (InGaSnO) and so on. Preferably, the active layer 304 is formed by IGZO or IZO. The thickness of the active layer 304 may be about 10~100 nm.

After the active layer 304 is formed, a raw material for forming the ohmic contact layer is injected into the second groove 321 by an injection process to form the ohmic contact layer 305a.

For example, the ohmic contact layer 305a may be formed by an oxide material comprising elements In, Ga, Zn, Sn and so on, such as IGZO, IZO, InSnO, InGaSnO and so on. In order to improve the contact property between source and drain electrodes and the active layer, the conductivity of the ohmic contact layer 305a should be better than that of the active layer 304. For example, aluminum (Al), lithium (Li) or other metals may be doped into the ohmic contact layer 305a to increase the conductivity of the ohmic contact layer 305a. For example, the thickness of the ohmic contact layer is same as that of the active layer, for example, about 10~100 nm.

As described above, the ohmic contact layer is directly formed by using the injection process. Preferably, the ohmic contact layer is formed by using the inkjet printing process. Accordingly, it does not need to perform an etching process using an etching solution to form the ohmic contact layer, and the damage on the active layer caused by the etching solution can be avoided. In addition, when the ohmic contact layer is formed by using the inkjet printing process, it needs to perform a curing and annealing process, and the annealing temperature may be set to about 200~500° C.

In addition, the active layer and the ohmic contact layer may be both formed by using the injection process. In this case, the raw material for forming the ohmic contact layer and the raw material for forming the active layer may be respectively injected into the second groove and the first groove simultaneously. Alternatively, the raw material for forming the ohmic contact layer and the raw material for forming the active layer may be respectively injected into the second groove and the first groove in time sequence so as to avoid the interference between the raw material for forming the ohmic contact layer and the raw material for forming the active layer.

For example, the surface of the active layer 304 and the surface of the ohmic contact layer 305a are provided in the same plane, that is, the active layer 304 and the ohmic contact layer 305a are provided in the same layer. Thus, the ohmic contact property between the source and drain electrodes and the active layer can be improved.

For example, the ohmic contact layer 305a has a uniform conductivity. That is, the conductivity of the entire ohmic contact layer 305a is identical.

Figure 3G:
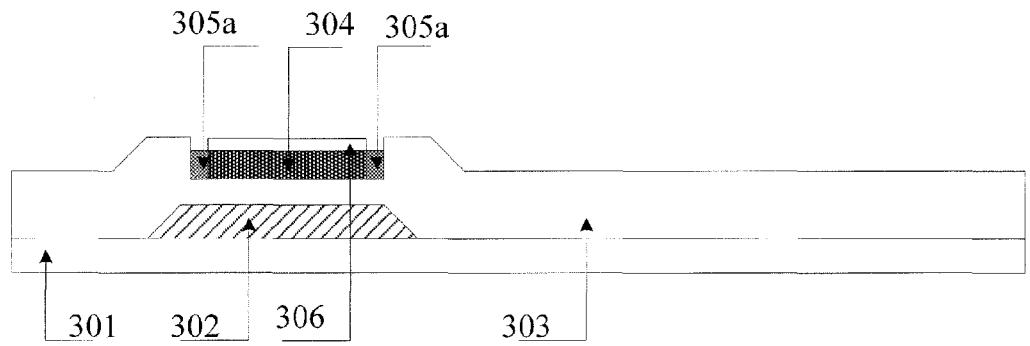

Step S305: forming an etching barrier layer 306 on the active layer 304, as shown in FIG. 3G.

For example, the etching barrier layer 306 may be a single layer formed by SiOx, SiNx, HfOx or AlOx, or the etching barrier layer 306 may be a laminated layer formed by two or more of the above-mentioned materials. In addition, the hydrogen content of the etching barrier layer 306 is controlled to be about 1% to 10%.

Figure 3H:
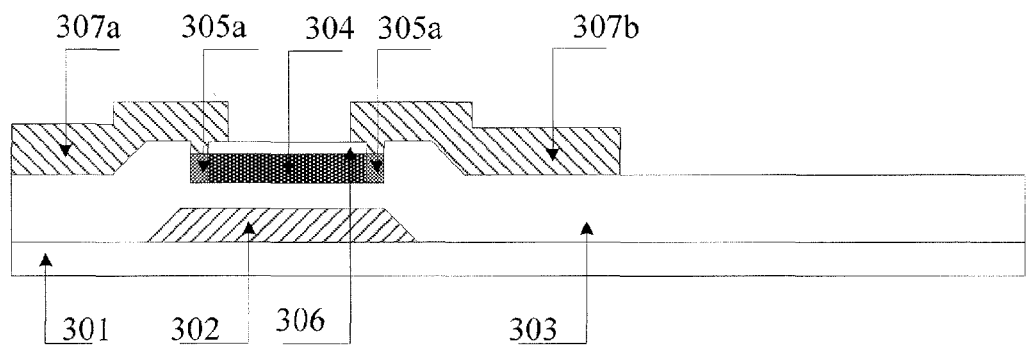

Step S306: forming a source and drain electrodes metal layer and performing a patterning process to form a source electrode 307a and a drain electrode 307b, so that the source electrode 307a and the drain electrode 307b are respectively in contact with the ohmic contact layer 305a, as shown in FIG. 3H.

For example, the source and drain electrodes metal layer may be a single layer formed by Mo, MoNb, Al, AlNd, Ti or Cu, or the source and drain electrodes metal layer may be a laminated layer formed by two or more of the above-mentioned materials. Preferably, the source and drain electrodes metal layer may be the single layer or the laminated layer formed by Mo, Al or an alloy comprising Mo, Al.

The present embodiment further provides a manufacturing method of an array substrate. The manufacturing method, of the array substrate comprises the above step S301 to step S306. In the step S301, a gate line (not shown) may be further formed, and the gate line is disposed at the same layer as the gate electrode 302. In the step S306, a data line (not shown) may be further formed, and the data line is disposed at the same layer as the source electrode 307a and the drain electrode 307b.

In addition, the manufacturing method of the array substrate further comprises the following steps.

Figure 3I:
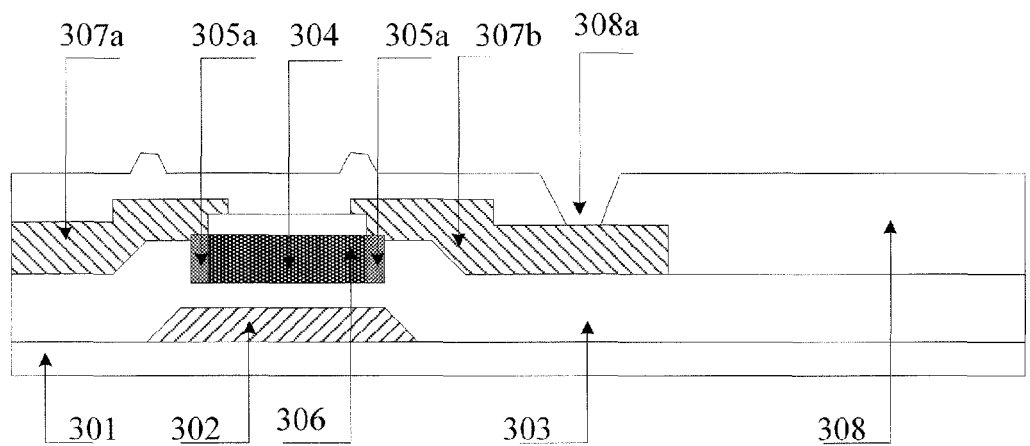
FIGS. 3I-3J are cross-section schematic views illustrating a manufacturing method of an array substrate according to the first embodiment of the invention.

Step S307: forming a passivation layer 308 on the source and drain electrodes, and performing a patterning process on the passivation layer 308 to form a via hole 308a, as shown in FIG. 3I.

For example, the passivation layer 308 may be a single layer formed by SiOx, SiNx, HfOx or AlOx, or the passivation layer 308 may be laminated layer formed by two or more of the above-mentioned materials. The passivation layer 308 may be formed by using a PECVD method. In addition, the hydrogen content of the passivation layer 308 is controlled to a relatively low level, and preferably, the hydrogen content is controlled to be about 1% to 10%.

Figure 3J:
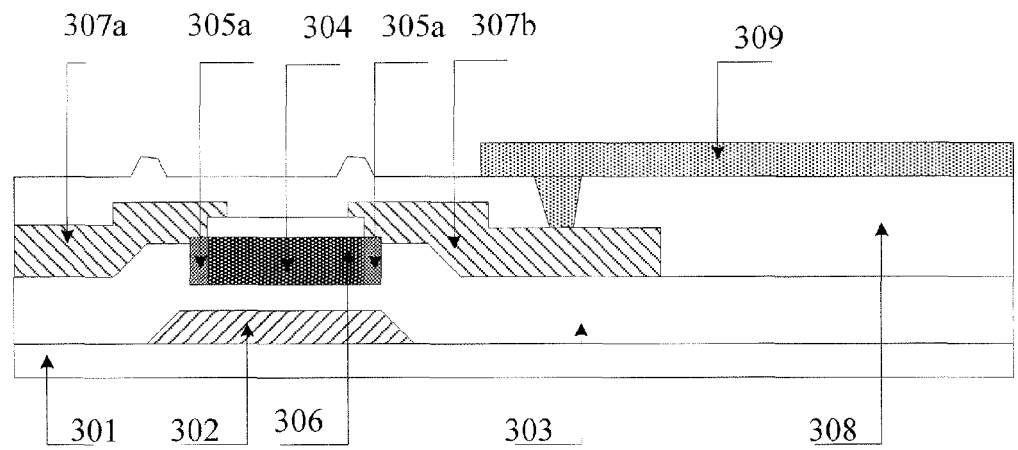

Step S308: forming a pixel electrode layer on the passivation layer 308 and performing a patterning process to form a pixel electrode 309, as shown in FIG. 3J.

For example, the pixel electrode 309 may be formed by a transparent conductive material such as indium tin oxide (ITO). The pixel electrode layer 309 may be formed by a sputtering method, and may be subjected to an annealing treatment after the sputtering process. A thickness of the pixel electrode may be about 20~150 nm.

The pixel electrode 309 is connected with the drain electrode 307b through the via hole 308a.

In the present embodiment, the active layer and the ohmic contact layer are respectively formed in the first groove and the second groove communicated with each other in the gate insulation layer to be in direct contact with each other, so that the subsequent formed source and drain electrodes can be in good ohmic contact with the active layer by the ohmic contact layer.

In the present embodiment, by forming the first groove and the second groove in the gate insulation layer and injecting the raw material for forming the ohmic contact layer into the second groove, the ohmic contact layer with desired shape can be directly formed. Thus, the etching process for forming the ohmic contact layer can be omitted, and the damage caused by the etching solution (which is employed in the etching process for forming the ohmic contact layer) on the oxide active layer and the ohmic contact layer can be avoided.

Second Embodiment

The second embodiment of the invention provides a method of manufacturing a thin film transistor. The present embodiment is different from the first embodiment in that: performing a patterning process on the gate insulation layer by using a dual-tone mask plate.

For example, in the present embodiment, the active layer and the ohmic contact layer are formed in the following manner.

First, forming a photoresist layer on the gate insulation layer, and performing exposing and developing processes on the photoresist layer by using the dual-tone mask plate to form a photoresist-completely-removed region, a photoresist-partially-retained region and a photoresist-completely-retained region, wherein the photoresist-completely-removed region corresponds to a region where the active layer is to be formed, the photoresist-partially-retained region corresponds to a region where the ohmic contact layer is to be formed, and the photoresist-completely-retained region corresponds to other region;

Next, performing a first etching process on the gate insulation layer in the photoresist-completely-removed region to form the first groove, and then forming the active layer in the first groove by using an injection process;

Next, removing the photoresist in the photoresist-partially-retained region, performing a second etching process on the gate insulation layer in this region to form the second groove, and then forming the ohmic contact layer in the second groove by using an injection process; and Finally, removing the photoresist in the photoresist-completely-retained region.

Figure 4A:
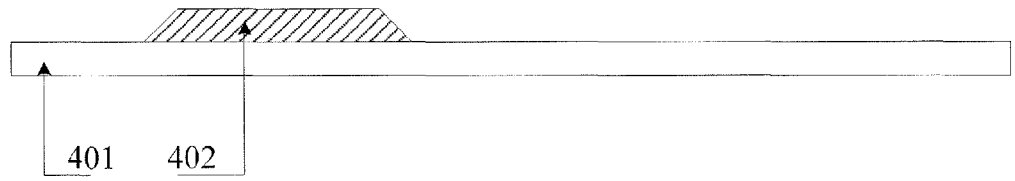
FIGS. 4A-4L are cross-section schematic views illustrating a manufacturing method of a thin film transistor according to a second embodiment of the invention.
Figure 4B:
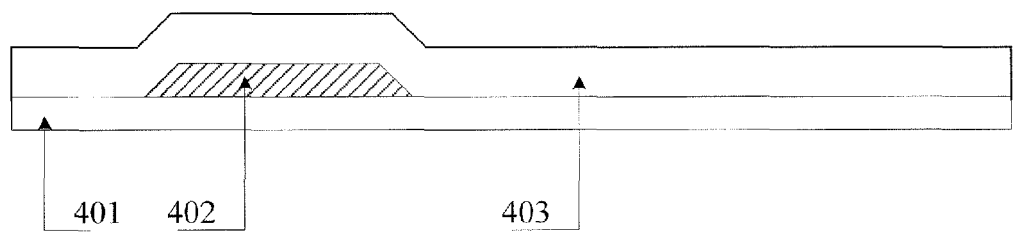
Figure 4C:
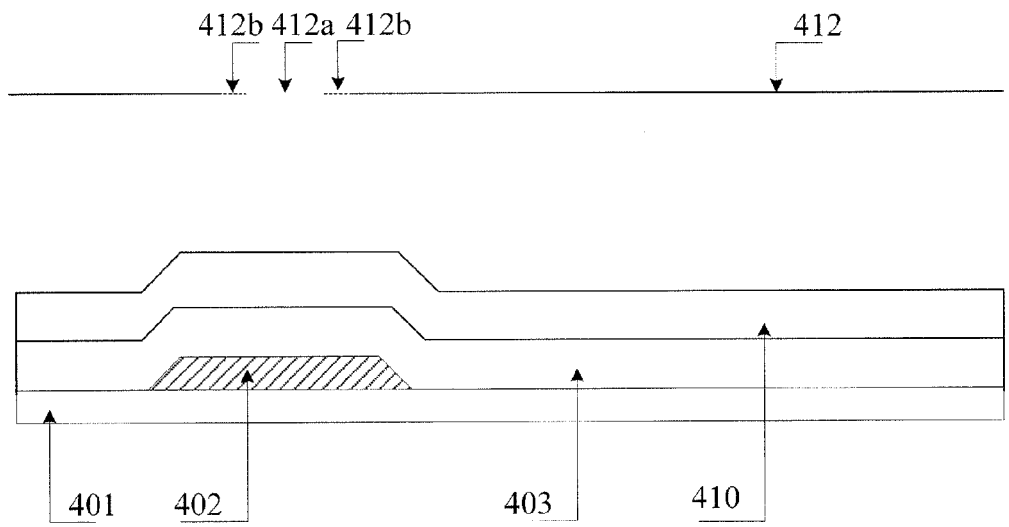
Figure 4D:
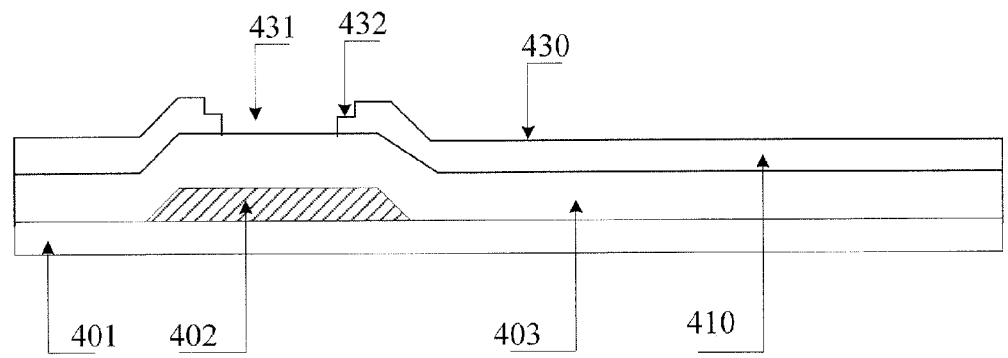
Figure 4E:
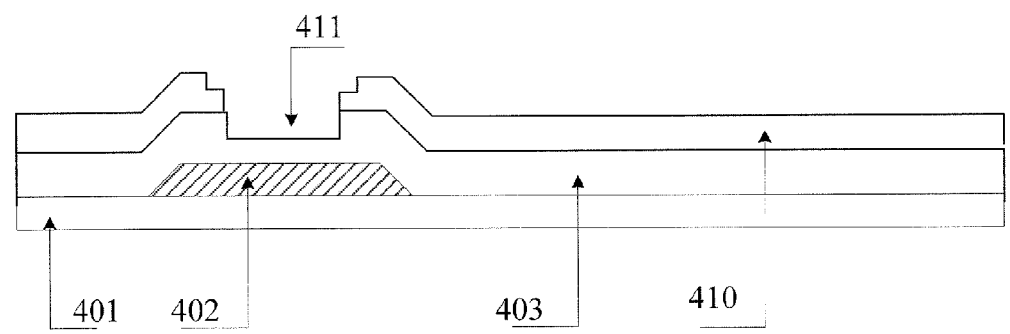
Figure 4F:
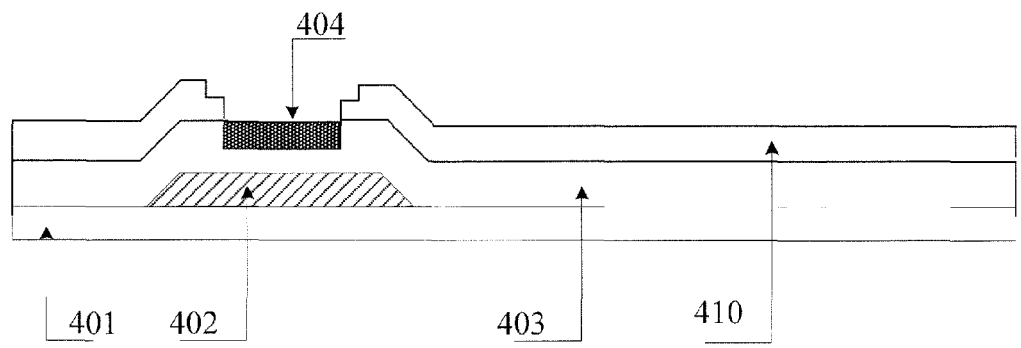
Figure 4G:
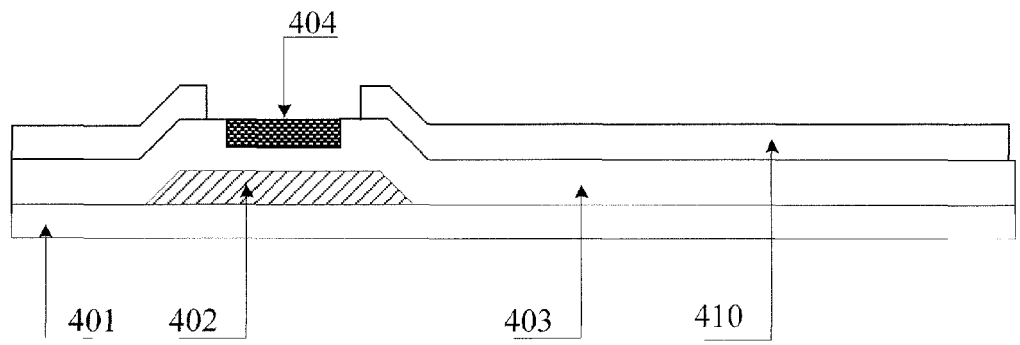
Figure 4H:
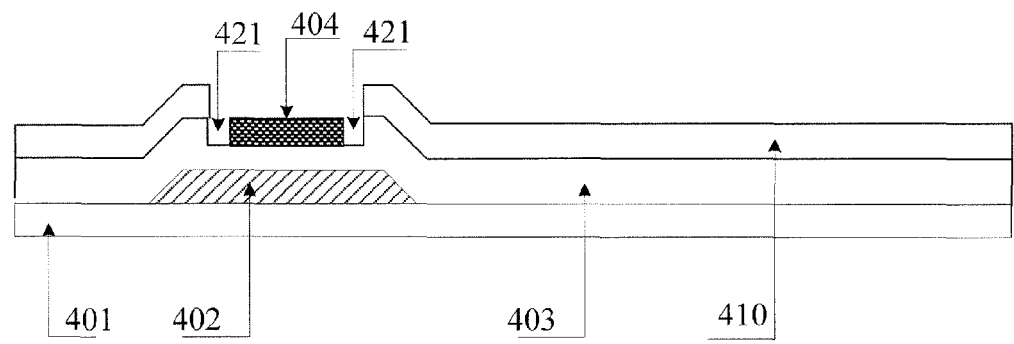
Figure 4I:
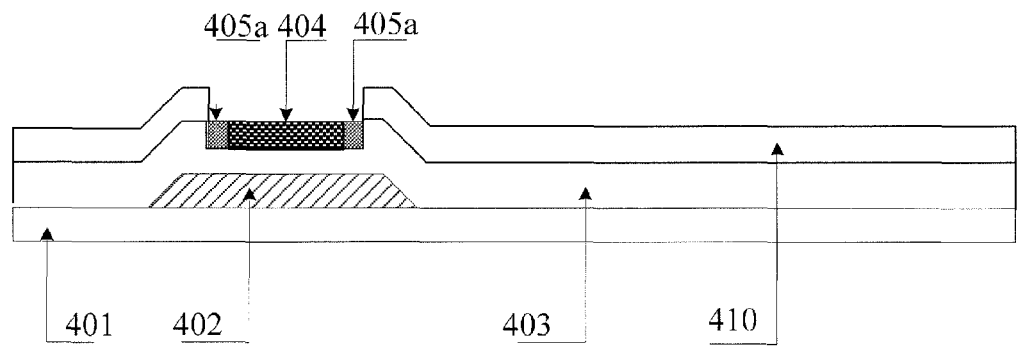
Figure 4J:
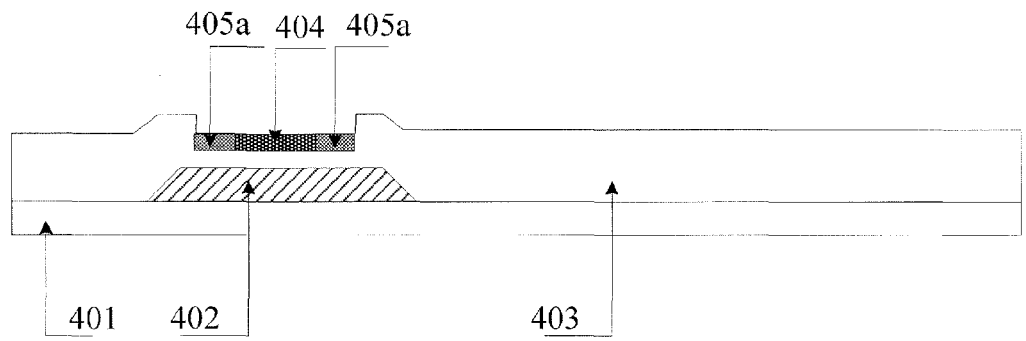
Figure 4K:
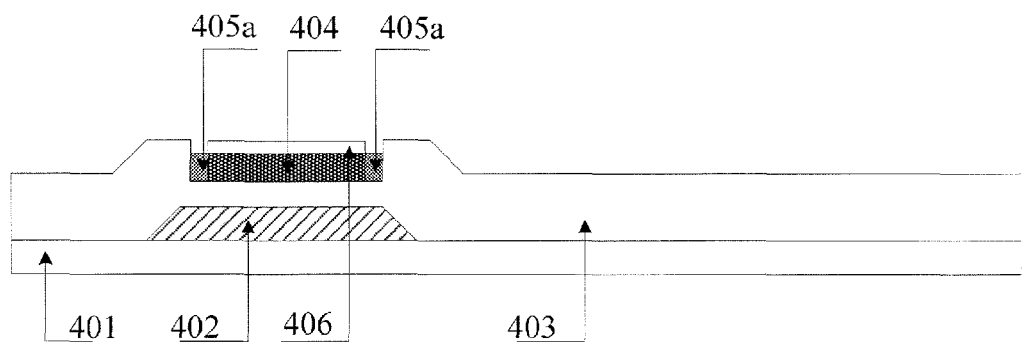
Figure 4L:
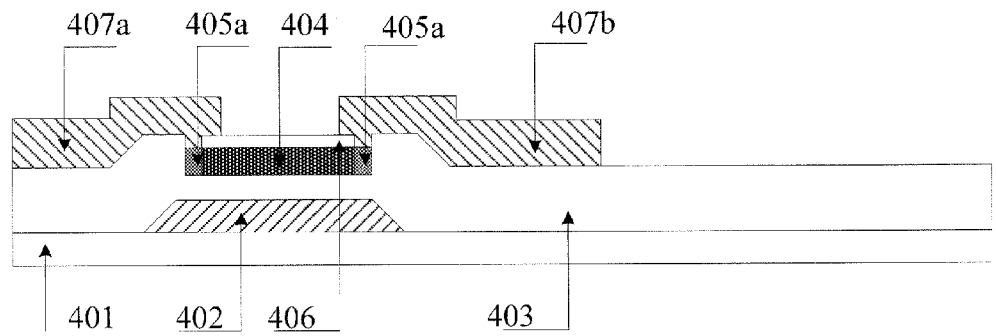
Figure 4M:
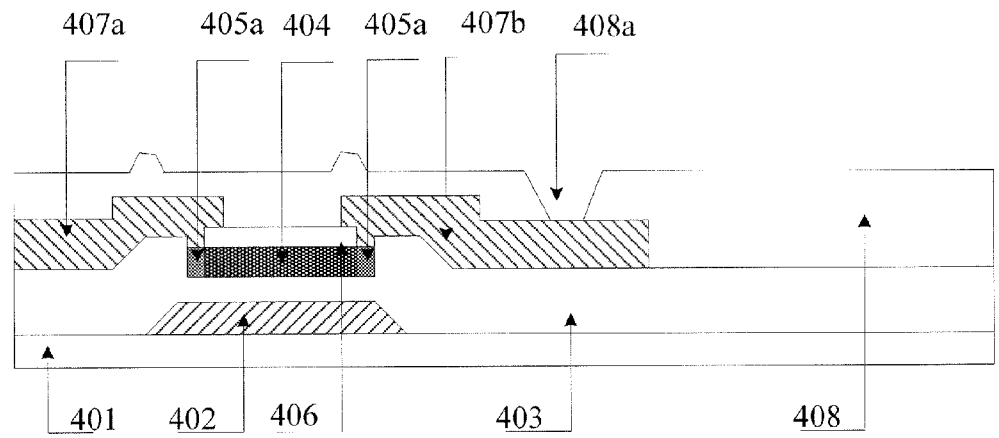
FIGS. 4M-4N are cross-section schematic views illustrating a manufacturing method of an array substrate according to the second embodiment of the invention.
Figure 4N:
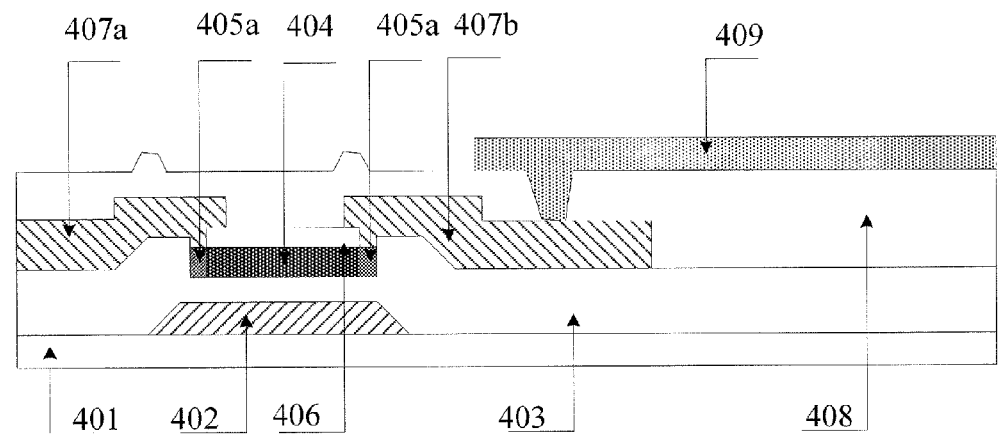

Referring to FIG. 4A-4N, the method of manufacturing the thin film transistor according to the second embodiment may comprise the following steps.

Step 401: forming the gate electrode 402 on the substrate 401, as shown in FIG. 4A. This step is similar to the step S302 of the first embodiment, and details thereof are omitted here for simplicity.

Step 402: forming the gate insulation layer 403 on the substrate after the step S401, as shown in FIG. 4B. This step is similar to the step S302 of the first embodiment, and details thereof are omitted here for simplicity.

Step 403: performing a patterning process on the gate insulation layer 403 to form the first groove 411 and the second groove 421 communicated with each other, and forming the active layer 404 in the first groove 411 and forming the ohmic contact layer 405a in the second groove 421, as shown in FIG. 4J. The second groove 421 is provided outside of the first groove 411 and is communicated with the first groove 411.

The following will give a detailed description of the step 403 by taking the case that the positive photoresist is employed as an example. For example, the step 403 further comprises the following steps.

Step 4031: forming the photoresist layer 410 on the gate insulation layer 403, and performing exposing and developing processes on the photoresist layer 410 by using the dual-tone mask plate 412 to form the photoresist-completely-removed region 431, the photoresist-partially-retained region 432 and the photoresist-completely-retained region 430, as shown in FIG. 4D. The photoresist-completely-removed region 431 corresponds to the region where the first groove 411 is to be formed, the photoresist-partially-retained region 432 corresponds to the region where the second groove 421 is to be formed, and the photoresist-completely-retained region 430 corresponds to other region.

The above-described dual-tone mask plate 412 may be a half-tone mask plate or a gray-tone mask plate. As shown in FIG. 4C, the dual-tone mask plate 412 comprises a light transmitting region 412a, a light partially transmitting region 412b and a light blocking region.

Step 4032: performing the first etching process on the gate insulation layer in the photoresist-completely-removed region 431 to form the first groove 411, as shown in FIG. 4E.

Step 4033: forming the active layer 404 in the first groove 411, as shown in FIG. 4F.

For example, the injection process such as inkjet printing process is used to form the active layer 404 in the first groove.

Alternatively, a semiconductor layer may be formed firstly and then a patterning process is performed to form the active layer 404 in the first groove 411.

Step 4034: removing the photoresist in the photoresist-partially-retained region 432 by using an ashing process to expose the gate insulation layer in this region, as shown in FIG. 4G.

Step 4035: performing the second etching process on the exposed gate insulation layer in the photoresist-partially-retained region 432 to form the second groove, as shown in FIG. 4H. The second groove corresponds to the region where the ohmic contact layer is to be formed and has the same shape as the ohmic contact layer.

For example, the gate insulation layer is etched by using a dry etching method.

Step 4036: injecting the raw material for forming the ohmic contact layer into the second groove to form the ohmic contact layer 405a, as shown in FIG. 4I.

For example, the ohmic contact layer 405a has a uniform conductivity. That is, the conductivity of the entire ohmic contact layer 405a is identical.

Step 4037: removing the remaining photoresist layer in the photoresist-completely-retained region 430, as shown in FIG. 4J.

Step 404: forming the etching barrier layer 406 on the active layer 404, as shown in FIG. 4K.

Step 405: forming the source electrode 407a and the drain electrode 407b on the etching barrier layer 406, as shown in FIG. 4L.

The present embodiment further provides a manufacturing method of an array substrate. The manufacturing method of the array substrate comprises the above steps 401 to 405. In the step 401, the gate line (not shown) may be further formed, and the gate line is disposed at the same layer as the gate electrode 402. In the step 407, the data line (not shown) may be further formed, and the data line is disposed at the same layer as the source electrode 407a and the drain electrode 407b.

In addition, the manufacturing method of the array substrate further comprises the following steps.

Step 406: forming the passivation layer 408 on the source electrode 407a and the drain electrode 407b, and performing a patterning process on the passivation layer 408 to form the via hole 408a, as shown in FIG. 4M.

Step 407: forming the pixel electrode layer on the passivation layer 408, and performing a patterning process to form the pixel electrode 409, as shown in FIG. 4N. The pixel electrode 409 is connected with the drain electrode 407b through the via hole 408a.

In the second embodiment, the materials of the gate electrode 402, the gate insulation layer 403, the active layer 404, the ohmic contact layer 405a, the etching barrier layer 406, the source and drain electrodes 407a and 407b, the passivation layer 408 and the pixel electrode 409 may be same as those in the first embodiment, and details thereof are omitted here for simplicity.

The second embodiment can achieve the same technical effect as the above described first embodiment. In addition, in the second embodiment, the ohmic contact layer and the active layer are separately formed, and thus the operability of the manufacturing process can be improved.

Third Embodiment

The third embodiment provides a manufacturing method of a thin film transistor. The third embodiment is different from the first embodiment in that: the conductivity of the ohmic contact layer is not uniform, and is gradually increased in a direction from the active layer to the source or drain electrode.

For example, in the third embodiment, the ohmic contact layer comprises at least two sub-ohmic-contact-layers in contact with each other in the direction from the active layer to the source or drain electrode, and the conductivities of the at least two sub-ohmic-contact-layers are gradually increased in the direction from the active layer to the source or drain electrode. The ohmic contact layer in the third embodiment can better improve the ohmic contact property between the active layer and the source and drain electrodes, so that the electron mobility can be improved further.

For example, in the third embodiment, the active layer and the ohmic contact layer are formed in the following manner.

Firstly, forming a photoresist layer on the gate insulation layer;

Next, performing exposing and developing processes on the photoresist layer by using a multi-tone mask plate so as to form a photoresist-completely-removed region, a first to n-th photoresist-partially-retained regions and a photoresist-completely-retained region, wherein n is an integer greater than 2, the thicknesses of the photoresist in the first to n-th photoresist-partially-retained regions are gradually increased, and the photoresist-completely-removed region corresponds to the region where the active layer is to be formed, the first to n-th photoresist-partially-retained regions correspond to the region where the ohmic contact layer is to be formed, and the photoresist-completely-retained region corresponds to other region;

Next, etching the gate insulation layer in the photoresist-completely-removed region to form the first groove, and then forming the active layer in the first groove by using an injection process;

Next, removing the photoresist in the first photoresist-partially-retained region and etching the gate insulation layer in this region to form a first portion of the second groove, and then forming a first sub-ohmic-contact-layer in the first portion of the second groove by using an injection process;

Next, removing the photoresist in the second photoresist-partially-retained region and etching the gate insulation layer in this region to form a second portion of the second groove, and then forming a second sub-ohmic-contact-layer in the second portion of the second groove by using an injection process;

Next, in the same way as that for forming the first sub-ohmic-contact-layer and the second sub-ohmic-contact-layer, forming a third sub-ohmic-contact-layer up to a (n-1)-th sub-ohmic-contact-layer;

Next, removing the photoresist in the n-th photoresist-partially-retained region, and etching the gate insulation layer in this region to form a n-th portion of the second groove, and then forming a n-th sub-ohmic-contact-layer in the n-th portion of the second groove by using an injection process; and Finally, removing the photoresist in the photoresist-completely-retained region.

The first sub-ohmic-contact-layer is in contact with the active layer, and the n-th ohmic contact layer is in contact with the source or drain electrode. The conductivity of the ohmic contact layer is gradually increased from the first sub-ohmic-contact-layer to the nth sub-ohmic-contact-layer. For example, materials with different conductivities may be used to form the first sub-ohmic-contact-layer to the n-th ohmic contact layer.

The following will give a detailed description of this embodiment by taking the case that the ohmic contact layer comprises three sub-ohmic-contact-layers in contact with each other as an example. The following only give a description of the process procedure of forming the active layer and the ohmic contact layer. The process procedure of forming other components (as shown in FIGS. 5A, 5B, 5R and 5S) are the same as those of the first embodiment or the second embodiment, and details thereof are omitted.

Figure 5A:
Figure 5B:
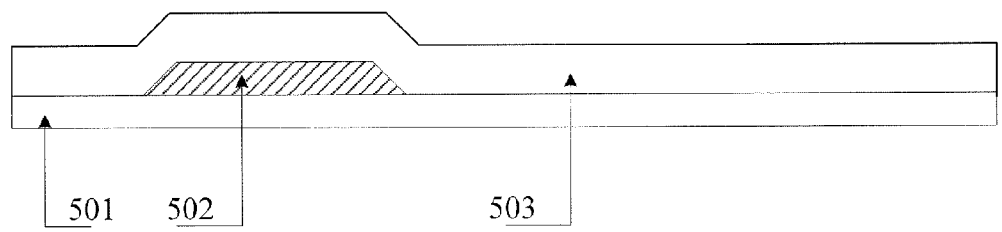
Figure 5C:
Figure 5C:
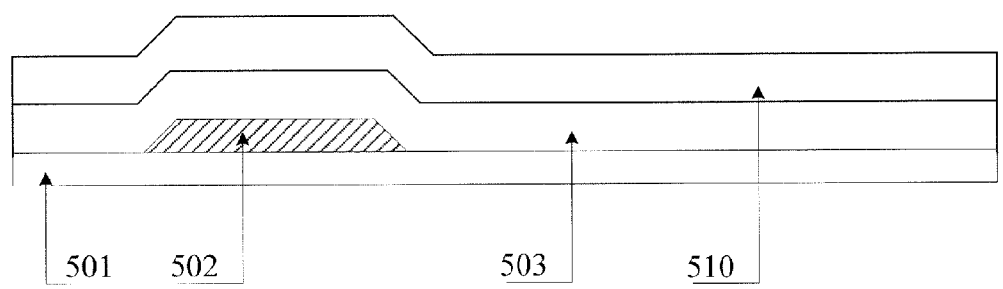
Figure 5D:
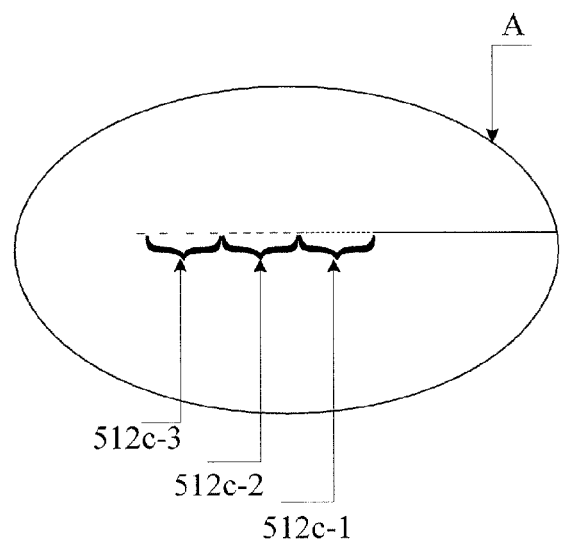
FIG. 5D is an enlargement view of a portion indicated by a mark A in FIG. 5C.
Figure 5E:
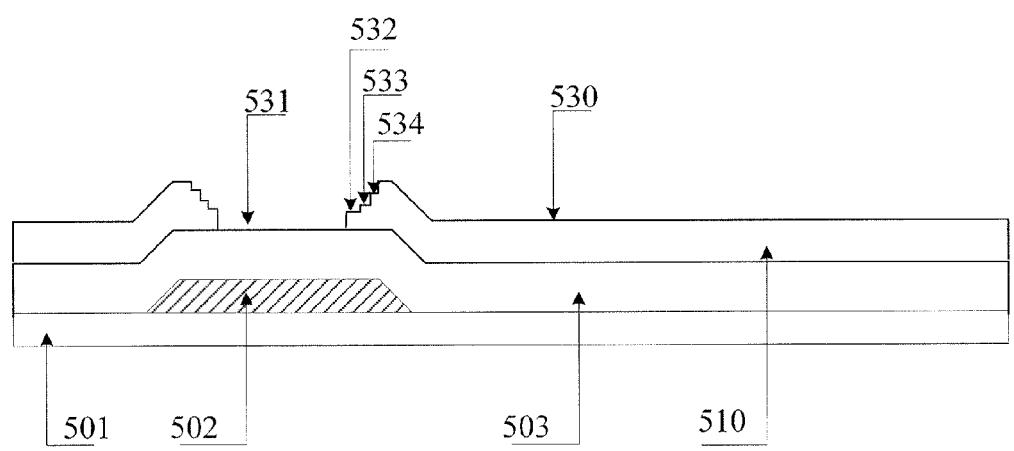
Figure 5F:
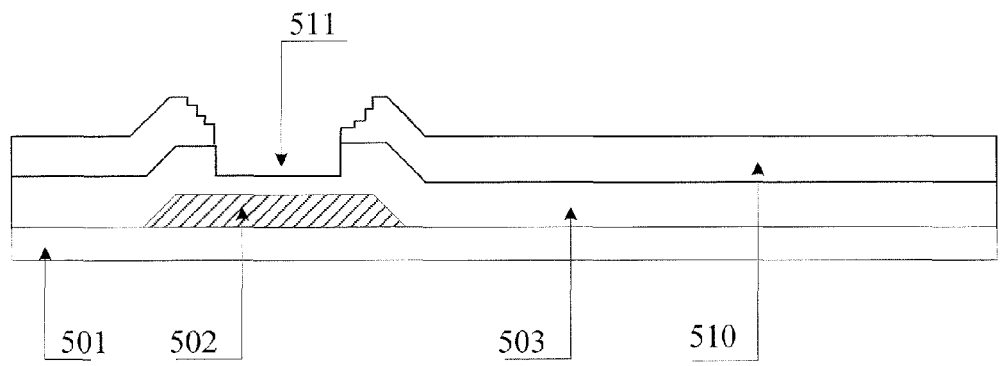
Figure 5G:
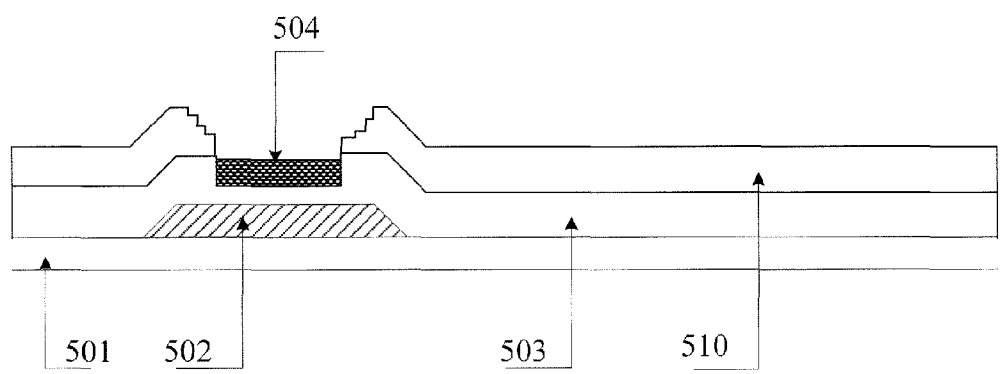
Figure 5H:
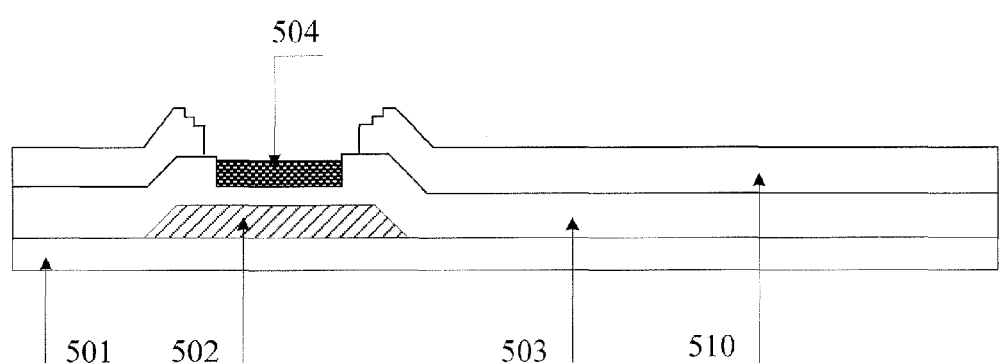
Figure 5I:
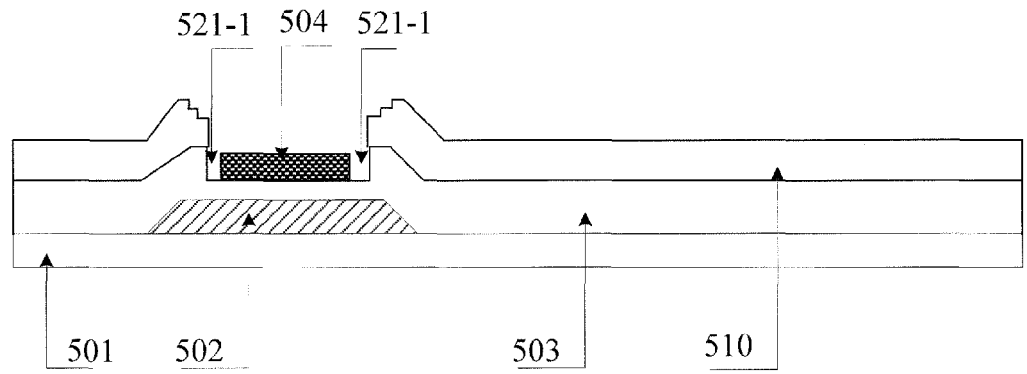
Figure 5J:
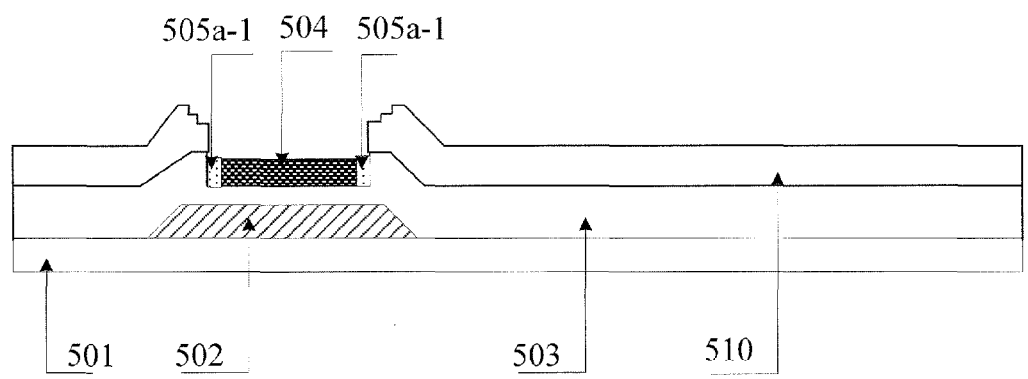
Figure 5K:
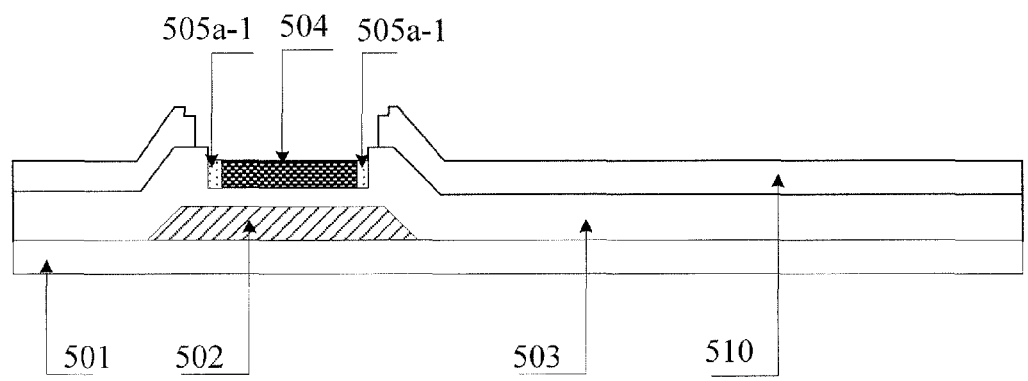
Figure 5L:
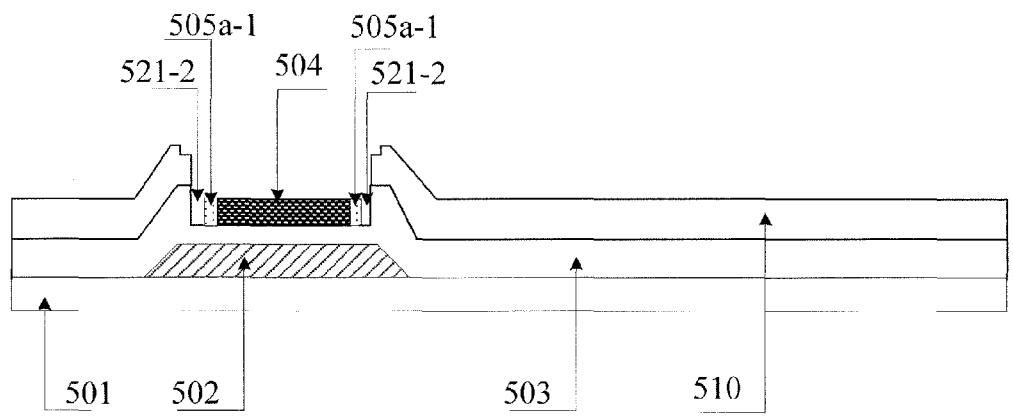
Figure 5M:
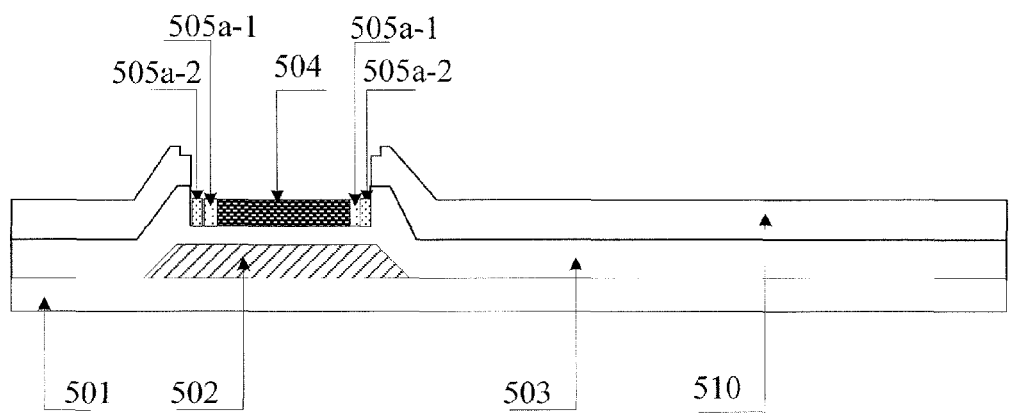
Figure 5N:
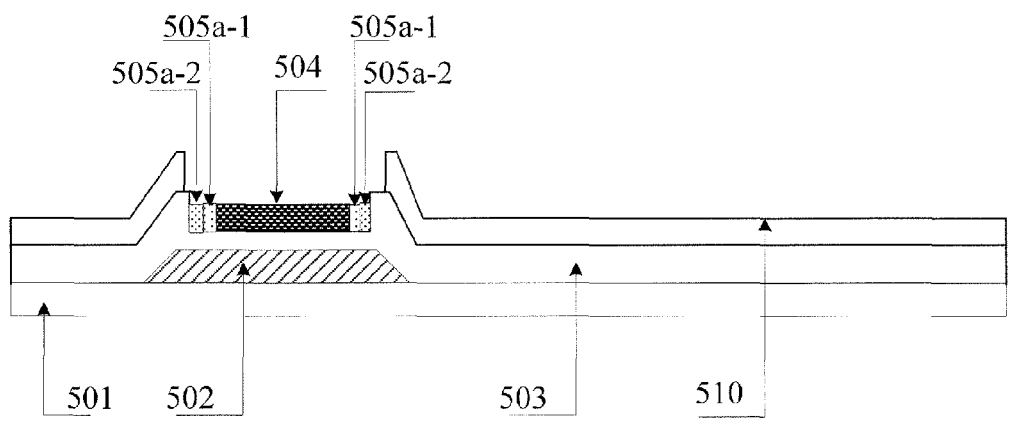
Figure 5O:
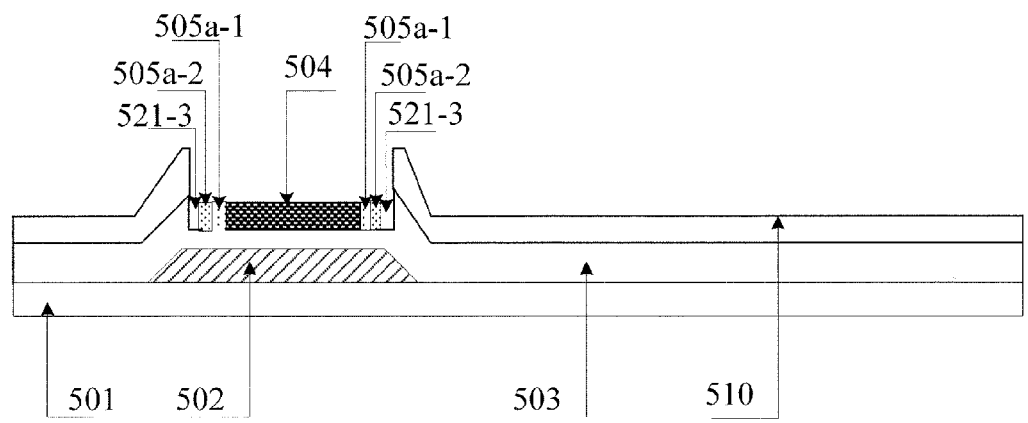
Figure 5P:
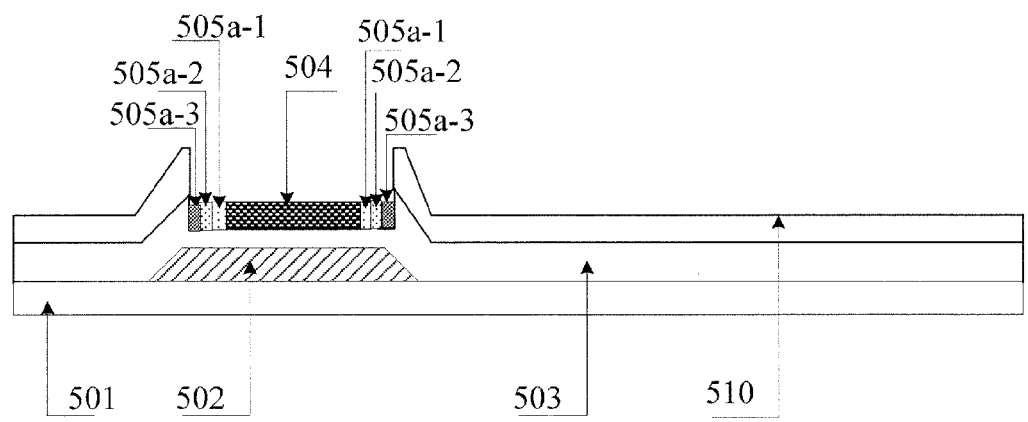
Figure 5Q:
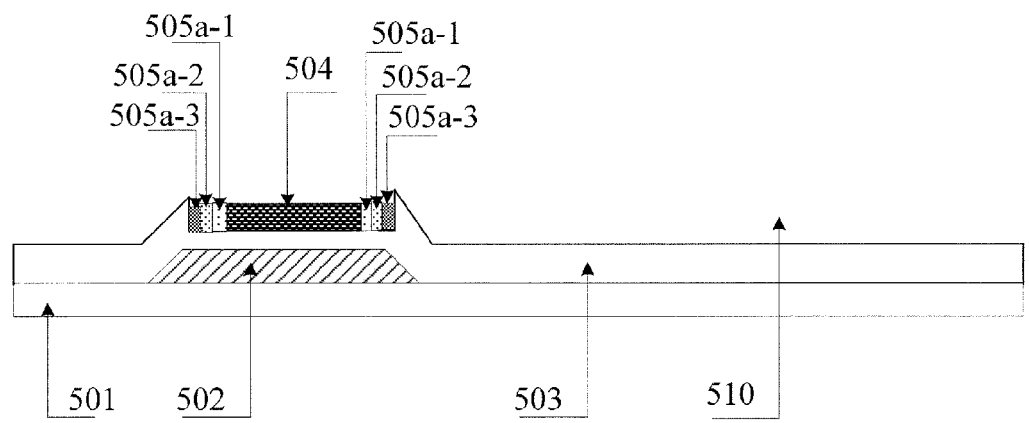
Figure 5R:
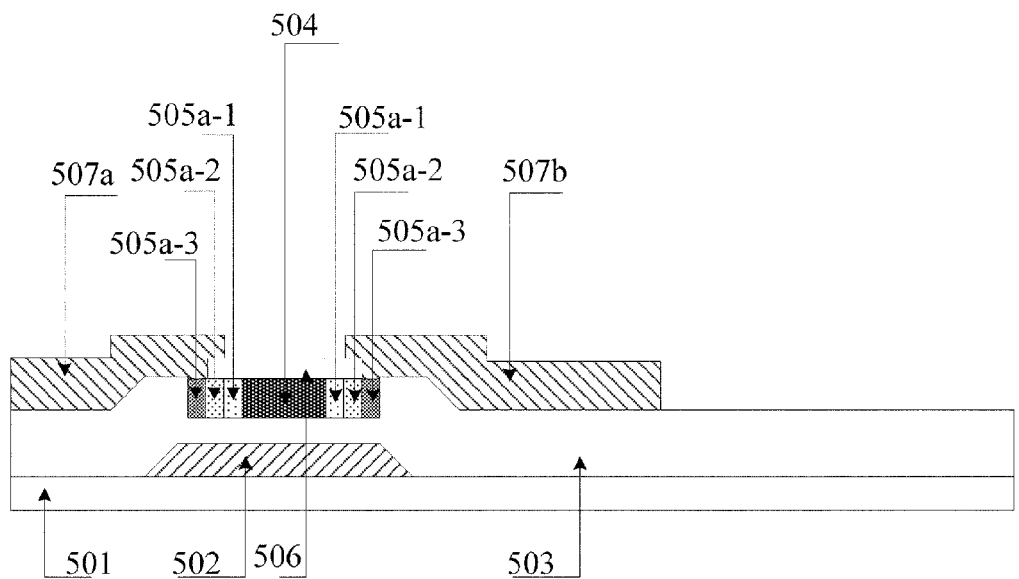
Figure 5S:
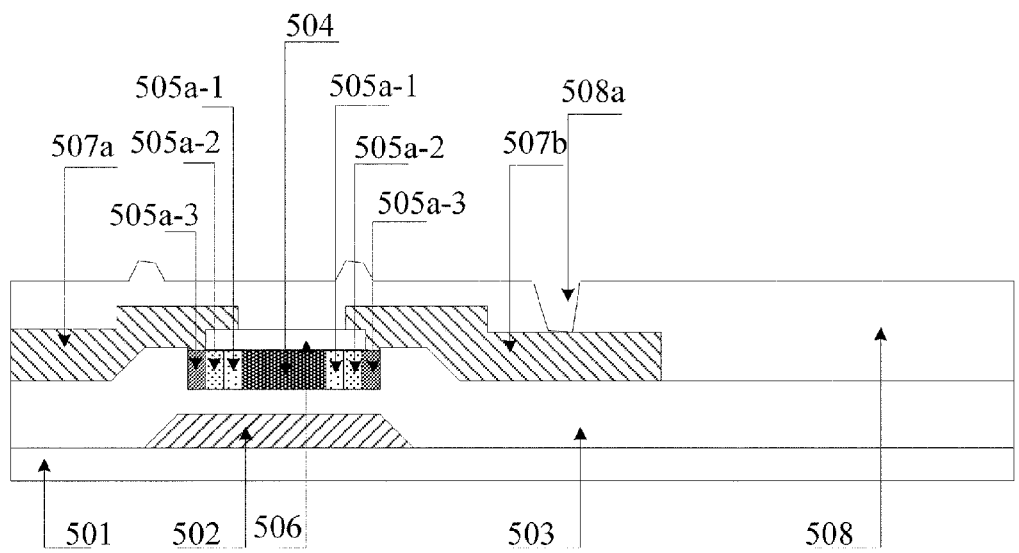
FIGS. 5S-5T are cross-section schematic views illustrating a manufacturing method of an array substrate according to the third embodiment of the invention.
Figure 5T:
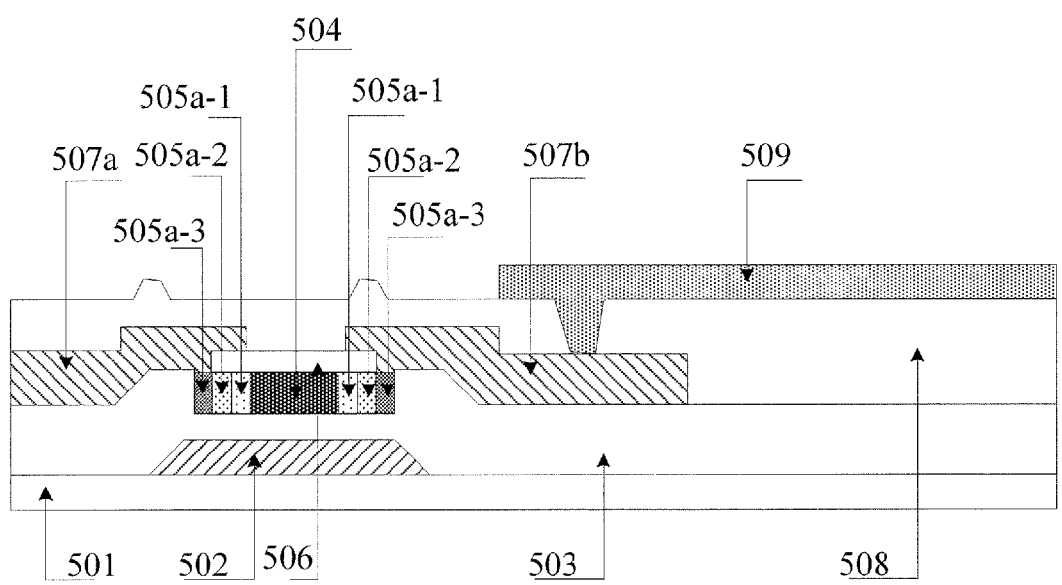

For example, as shown in FIG. 5T, the ohmic contact layer comprises a first sub-ohmic-contact-layer 505a-1, a third sub-ohmic-contact-layer 505a-3, and a second sub-ohmic-contact-layer 505a-2 between the first sub-ohmic-contact-layer 505a-1 and the second sub-ohmic-contact-layer 505a-2, the first sub-ohmic-contact-layer 505a-1 is in contact with the active layer 504, the third sub-ohmic-contact-layer 505a-3 is in contact with the source electrode 507a or the drain electrode 507b. The conductivity of the first sub-ohmic-contact-layer 505a-1 is lower than that of the second sub-ohmic-contact-layer 505a-2, and the conductivity of the second sub-ohmic-contact-layer 505a-2 is lower than that of the third sub-ohmic-contact-layer 505a-3.

For example, the second groove comprises a first portion, a second portion and a third portion that are formed by three etching processes, and the first portion of the second groove, the second portion of the second groove and the third portion of the second groove are communicated with each other.

As shown in FIGS. 5C and 5D, a photoresist layer 510 is formed on the gate insulation layer 503, and exposing and developing processes are performed on the photoresist layer 510 by using a mask plate 512 having a completely exposing region 512a, a half exposing region 512c-3, a one-third exposing region 512c-2 and a one-fifth exposing region 512-c so as to form a photoresist-completely-retained region 530, a photoresist-completely-removed region 531, a first photoresist-partially-retained region 532, a second photoresist-partially-retained region 533, and a third photoresist-partially-retained region 534, as shown in FIG. 5E. The gate insulation layer 503 in the photoresist-completely-removed region 531 is etched to form the first groove 511, as shown in FIG. 5F. The active layer 504 is formed by injecting the raw material for forming the active layer 504 into the first groove 511, as shown in FIG. 5G. Alternatively, the active layer 504 may be formed in the first groove 511 by firstly forming a semiconductor layer and then performing a patterning process on the semiconductor layer.

After forming the active layer 504, the photoresist in the first photoresist-partially-retained region 532 is removed by an ashing process, as shown in FIG. 5H. The gate insulation layer 503 in the first photoresist-partially-retained region 532 is etched to form the first portion 521-1 of the second groove, as shown in FIG. 5I. The first sub-ohmic-contact-layer 505a-1 is formed in the first portion 521-1 of the second groove, as shown in FIG. 5J. The photoresist in the second photoresist-partially-retained region 533 is removed, as shown in FIG. 5K. The gate insulation layer 503 in the second photoresist-partially-retained region 533 is etched to form the second portion 521-2 of the second groove, as shown in FIG. 5L. The second sub-ohmic-contact-layer 505a-2 is formed in the second portion 521-2 of the second groove, as shown in FIG. 5M. The photoresist in the third photoresist-partially-retained region 534 is removed, as shown in FIG. 5N. The gate insulation layer 503 in the third photoresist-partially-retained region 534 is etched to form the third portion 521-3 of the second groove, as shown in FIG. 5O. The third sub-ohmic-contact-layer 505a-3 is formed in the third portion 521-3 of the second groove, as shown in FIG. 5P. Finally, the remaining photoresist layer 4 is removed to form a structure shown in FIG. 5Q.

Among the first sub-ohmic-contact-layer, the second sub-ohmic-contact-layer and third sub-ohmic-contact-layer, the first sub-ohmic-contact-layer has a lowest conductivity, the third sub-ohmic-contact-layer has a highest conductivity, and the second sub-ohmic-contact-layer has a conductivity between the conductivity of the first sub-ohmic-contact-layer and the conductivity of the third sub-ohmic-contact-layer.

In the third embodiment, the portion of the ohmic contact layer that is in contact with the source electrode or the drain electrode has the highest conductivity, the portion of the ohmic contact layer that is in contact with the active layer has the lowest conductivity, and this lowest conductivity is still larger than the conductivity of the active layer. Thus, the ohmic contact property between the active layer and the source and drain electrodes can be further improved, and the electron mobility can be further improved as well.

The above-described first embodiment, second embodiment and third embodiment employ the positive photoresist; however, the negative photoresist may be used as well. In the case that the negative photoresist is used, it needs to adjust the pattern of the mask plate.

Fourth Embodiment

The fourth embodiment provides a thin film transistor, and the thin film transistor is manufactured by using the manufacturing method according to one of the above embodiments. The oxide thin film transistor comprises a gate electrode, a gate insulation layer, an active layer, an ohmic contact layer, an etching barrier layer, a source electrode and a drain electrode. The gate insulation layer has a first groove which has a shape same as that of the active layer in shape and a second groove which has a shape same as that of the ohmic contact layer. The first groove and the second groove are communicated with each other. The active layer is formed in the first groove, and the ohmic contact layer is formed in the second groove.

For example, a surface of the active layer and a surface of the ohmic contact layer are provided in the same plane.

The ohmic contact layer may have a uniform conductivity.

Alternatively, the ohmic contact layer may have a conductivity that is gradually increased in a direction from the active layer to the source or drain electrode, so as to improve the ohmic contact property between the active layer and the ohmic contact layer and improve the electron mobility.

The thin film transistor according to the fourth embodiment has the structure same as that of the thin film transistor (as shown in FIGS. 3H, 4L and 5R) formed by the manufacturing methods according to the above embodiments, and details thereof are omitted here for simplicity.

Fifth Embodiment

The fifth embodiment provides a display device, and the display device comprises the above-described thin film transistor. For example, the display device may be any product or component having a display function, such as a liquid crystal panel, an electronic paper, an OLED panel, a liquid crystal TV, a liquid crystal display, a digital photo frame, a mobile phone, a tablet PC and so on.

The thin film transistor, the manufacturing method thereof and the display device according to the embodiments of the invention can improve the ohmic contact property between the active layer and the source and drain electrodes by providing the active layer and the ohmic contact layer in the same plane. Since the active layer and the ohmic contact layer are embedded in the gate insulation layer, the source and drain electrodes can achieve very good contact with the active layer, and the adverse influence caused by variation of previously-formed layer pattern is relatively small. The oxide ohmic contact layer is formed by the injection process such as inkjet printing process, and thus the damage caused by the etching solution on the oxide active layer and the ohmic contact layer can be avoided.

The method for forming a thin film in the above embodiments may comprise: depositing, coating, sputtering, printing or other methods; the patterning process in the above embodiments may comprise: coating photoresist, exposing and developing, etching, aching, and removing photoresist, and the like.

It should be noted that, the above exemplary embodiments are only used to explain the basic principle of the invention, and do not intend to limit the invention. For example, the active layer may be formed by sputtering, and the inkjet printing process for forming the ohmic contact layer may be modified. In addition, when performing the patterning process on the gate insulation layer, a plurality of exposing processes may be respectively performed by using a plurality of normal mask plates without using the above-described dual-tone mask plate or multi-tone mask plate.

The foregoing embodiments merely are exemplary embodiments of the invention, and not intended to define the scope of the invention, and the scope of the invention is determined by the appended claims.

What is claimed is:

1. A manufacturing method of a thin film transistor, the thin film transistor comprising a gate electrode, a gate insulation layer, an active layer, an ohmic contact layer, a source electrode and a drain electrode, wherein the method comprises: forming the ohmic contact layer by an injection process;

wherein the method comprises: forming a first groove and a second groove communicated with each other in the gate insulation layer; forming the active layer in the first groove: and forming the ohmic contact layer in the second groove by the injection process;

wherein a conductivity of the ohmic contact layer is not uniform, and the method comprises:

forming a photoresist layer on the gate insulation layer;

performing exposing and developing processes on the photoresist layer by using a multi-tone mask plate so as to form a photoresist-completely-removed region, a first to n-th photoresist-partially-retained regions and a photoresist-completely-retained region, wherein n is an integer equal to or greater than 2, thicknesses of the photoresist in the first to n-th photoresist-partially-retained regions are gradually increased, and the photoresist-completely-removed region corresponds to a region where the active layer is to be formed, the first to n-th photoresist-partially-retained regions correspond to a region where the ohmic contact layer is to be formed, and the photoresist-completely-retained region corresponds to other region;

etching the gate insulation layer in this photoresist-completely-removed region to form the first groove, and then forming the active layer in the first groove;

removing the photoresist in the first photoresist-partially-retained region and etching the gate insulation layer in this region to form a first portion of the second groove, and then forming a first sub-ohmic-contact-layer in the first portion of the second groove by using the injection process;

removing the photoresist in the second photoresist-partially-retained region and etching the gate insulation layer in this region to form a second portion of the second groove, and then forming a second sub-ohmic-contact-layer in the second portion of the second groove by using the injection process;

in the same way as that for forming the first sub-ohmic-contact-layer and the second sub-ohmic-contact-layer, forming other sub-ohmic-contact-layers until removing the photoresist in the n-th photoresist-partially-retained region, etching the gate insulation layer in this region to form a n-th portion of the second groove and forming a n-th sub-ohmic-contact-layer in the n-th portion of the second groove by using the injection process; and removing the photoresist in the photoresist-completely-retained region.

2. The manufacturing method of the thin film transistor according to claim 1, wherein the first sub-ohmic-contact-layer, the second ohmic contact layer up to the n-th ohmic contact layer are provided in a same layer.

3. The manufacturing method of the thin film transistor according to claim 1, wherein the first groove has a shape same as that of the active layer, and the second groove has a shape same as that of the ohmic contact layer.

4. The manufacturing method of the thin film transistor according to claim 1, wherein the second groove is provided outside of the first groove.

5. The manufacturing method of the thin film transistor according to claim 1, wherein the first groove and the second groove have a same depth.

6. The manufacturing method of the thin film transistor according to claim 1, wherein the active layer and the ohmic contact layer are provided in a same layer.

7. The manufacturing method of the thin film transistor according to claim 1, wherein the injection process is an inkjet printing process.

8. The manufacturing method of the thin film transistor according to claim 1, wherein the active layer is formed by an injection process.

* * * * *